(12) United States Patent
Ehrenpfordt

(10) Patent No.: US 9,560,744 B2
(45) Date of Patent: Jan. 31, 2017

(54) COMPONENT AND METHOD FOR PRODUCING A COMPONENT

(75) Inventor: Ricardo Ehrenpfordt, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 493 days.

(21) Appl. No.: 13/981,900

(22) PCT Filed: Nov. 28, 2011

(86) PCT No.: PCT/EP2011/071197
§ 371 (c)(1),
(2), (4) Date: Oct. 9, 2013

(87) PCT Pub. No.: WO2012/100861
PCT Pub. Date: Aug. 2, 2012

(65) Prior Publication Data
US 2014/0022745 A1    Jan. 23, 2014

(30) Foreign Application Priority Data

Jan. 26, 2011  (DE) ................... 10 2011 003 195

(51) Int. Cl.
*H01L 23/28*   (2006.01)
*H05K 1/02*    (2006.01)
(Continued)

(52) U.S. Cl.
CPC ........... *H05K 1/0271* (2013.01); *B81B 7/0058* (2013.01); *H05K 3/32* (2013.01);
(Continued)

(58) Field of Classification Search
CPC .......... H05K 1/0271; H05K 3/32; H05K 3/28; H05K 3/284; H01L 23/3121; H01L 23/04; H01L 23/055; H01L 23/105; H01L 23/552; H01L 21/563; H01L 21/56; H01L 23/31076; H01L 23/10; H01L 23/3107; H01L 2224/48091; H01L 2224/48227; H01L 2224/73265; B81B 7/0058; Y10T 29/4913
(Continued)

(56) References Cited

U.S. PATENT DOCUMENTS 5,253,010 A * 10/1993 Oku ................... H01L 23/3121
361/749
5,737,191 A *  4/1998 Horiuchi ............... H01L 21/563
174/255

(Continued)

FOREIGN PATENT DOCUMENTS

CN        1790683 A    6/2006
CN      101252122 A    8/2008
(Continued)

OTHER PUBLICATIONS

International Search Report corresponding to PCT Application No. PCT/EP2011/071197, mailed May 7, 2012 (German and English language document) (7 pages).

*Primary Examiner* — Angel R Estrada
(74) *Attorney, Agent, or Firm* — Maginot, Moore & Beck LLP

(57) ABSTRACT

A component includes a substrate having at least one flexible substrate area which has at least one area reinforced by forming a material composite. The material composite includes at least a portion of the flexible substrate area. The component also includes a first microstructured or nanostructured element and a connecting mechanism configured to attach the first microstructured or nanostructured element to the flexible substrate area. A damping mass is configured to cover at least the first microstructured or nanostructured element and a portion of the substrate protruding over the material composite. The component is configured to provide (Continued)

a secure receptacle for the electronic element and to offer good vibration decoupling of the electronic element from vibrations of the component.

20 Claims, 2 Drawing Sheets

(51) Int. Cl.
  *B81B 7/00* (2006.01)
  *H05K 3/32* (2006.01)
(52) U.S. Cl.
  CPC ............... *H01L 2224/48091* (2013.01); *H01L 2224/48227* (2013.01); *H01L 2224/73265* (2013.01); *Y10T 29/4913* (2015.01)
(58) Field of Classification Search
  USPC .......... 174/520, 50, 50.5, 50.52, 50.53, 521, 174/535, 250, 255, 260, 262, 390; 361/749, 361/748, 750, 719, 820
  See application file for complete search history.

(56) References Cited

U.S. PATENT DOCUMENTS

| | | | | |
|---|---|---|---|---|
| 7,109,410 B2* | 9/2006 | Arnold | ................... | H01L 23/04 |
| | | | | 174/390 |
| 7,633,015 B2* | 12/2009 | Wurzel | ................. | H01L 23/552 |
| | | | | 174/260 |
| 8,130,503 B2* | 3/2012 | Watanabe | ............. | H01L 25/105 |
| | | | | 174/255 |
| 8,274,797 B2* | 9/2012 | Ono | ....................... | H01L 23/055 |
| | | | | 174/262 |
| 8,804,316 B2* | 8/2014 | Shiraki | ............. | G01C 19/5783 |
| | | | | 174/520 |
| 2010/0109103 A1 | 5/2010 | Tsao | | |

FOREIGN PATENT DOCUMENTS

| | | |
|---|---|---|
| DE | 103 32 303 A1 | 2/2005 |
| DE | 10 2005 041 577 A1 | 3/2006 |
| DE | 10 2006 011 753 A1 | 9/2007 |
| DE | 10 2009 001 930 A1 | 9/2010 |
| DE | 10 2010 030 960 A1 | 1/2012 |
| WO | 2006/026951 A1 | 3/2006 |

* cited by examiner

COMPONENT AND METHOD FOR PRODUCING A COMPONENT

This application is a U.S.C. §371 National Stage Application of PCT/EP2011/071197, filed on Nov. 28, 2011, which claims the benefit of priority to Ser. No. DE 10 2011 003 195.2, filed on Jan. 26, 2011 in Germany, the disclosures of which are incorporated herein by reference in their entirety.

The present disclosure relates to a component, in particular an electronic component, and a method for producing a component, in particular an electronic component, which offers good vibration decoupling of an electronic component from vibrations of the component.

BACKGROUND

Electrical elements, such as micromechanical sensors, are usually packaged in housings. Here, a distinction is drawn between housings having contact feet, what are known as leaded housings, and housings having contact surfaces, what are known as leadless housings. In particular, a micromechanical sensor can be inserted into a prefabricated, injection-molded basic housing, what is known as a pre-molded housing, which is then closed with a lid.

Depending on the installation location, micromechanical sensors can be subjected to different loadings. In particular, micromechanical sensors, for example ESP sensors in the control device, can be subjected to vibration loadings.

One possible way of protecting a sensor against these vibrations consists in fitting the sensor to a metal plate which is mounted on a gel layer. Another possible way is described in the document DE 10 2005 041 577 A1, in which undesired external vibrations are attenuated by a wiring element.

SUMMARY

The subject matter of the present disclosure is a component, in particular an electronic component, comprising a substrate with at least one flexible substrate area which has at least one area reinforced by forming a material composite, the material composite comprising at least one part of the flexible substrate area, a first micro-structured or nano-structured element and a connecting means for fixing the first micro-structured or nano-structured element to the flexible substrate area, and a damping mass being provided, which covers at least the first micro-structured or nano-structured element and a portion of the substrate protruding laterally beyond the material composite.

In the sense of the present disclosure, a damping mass can be understood in particular to mean a mass which is able to absorb mechanical energy, in particular vibration energy, and to convert it into internal energy, for example friction.

In the sense of the present disclosure, a micro-structured or nano-structured element can in particular be an element having internal structural dimensions in a range from ≥1 nm to ≤100 μm. Here, the internal structural dimensions mean the dimensions of structures within the element such as trenches, lands or conductor tracks. Such elements are used in microsystems technology or in micro-electromechanical systems.

In the sense of the present disclosure, a reinforced area is understood to mean an area which exhibits increased stiffness or hardness and therefore an increased resistance with respect to deformations, in particular in relation to the flexible substrate area as such.

A flexible substrate area can be understood in particular to mean an area of the substrate which is elastic and/or stretchable and/or deformable under the action of a low force. In particular, the flexible substrate area as such is more elastic and/or stretchable and/or deformable under the action of the same force than the reinforced area. For example, the flexible substrate area as such can be more elastic and/or stretchable and/or deformable under the action of the same force by the factor five, in particular ten, than the "reinforced area". The substrate can comprise one or multiple flexible areas, or the flexible substrate area is extended over the whole of the substrate, which means that the whole of the substrate is flexible.

Particularly preferably, the flexible substrate area is arranged at least in a lateral extent of the substrate which is provided for populating the substrate with an element, such as an electronic element, or else extends beyond said substrate in its entire extent.

According to the disclosure, such flexibility is combined with the rigid or reinforced area, which is formed by forming a material composite. This reinforced area can thus have a DiePad function, that is to say receive the component securely, in order thus to ensure the reliability or to serve for the secure fixing of the element.

The component according to the disclosure is therefore capable, firstly, of fixing an electronic element securely on the substrate and, secondly, of ensuring good vibration damping in order to reduce the risk of damage.

The material composite comprises at least one first micro-structured or nano-structured element and a connecting means for fixing the first micro-structured or nano-structured element to the flexible substrate area. This portion of the flexible substrate area to which the first micro-structured or nano-structured element is fixed is furthermore a portion of the material composite. In this simplest case, the first micro-structured or nano-structured element can be fixed to the substrate or to the flexible substrate area with a curable adhesive as connecting means, for example, by means of an adhesive-element composite, the adhesive curing on the substrate, for example. Curing the adhesive is important here, since the reinforcement originates in particular from the hardness of the element. In the event of deformation of the substrate or of the flexible area as such, forces therefore act on the adhesive element composite, which the adhesive must resist. The adhesive can be applied to the substrate for example by screen or stencil printing, for example by means of dispensing. Alternatively, an adhesive layer can also even be applied to the element at the wafer level, for example, by painting on or during a sawing process via a transfer tape. The adhesive can be a thermosetting plastic, which cures jointly in the chip composite, or else a thermoplastic, which is melted during application and then hardens again. A bonding layer can also connect the substrate and the element and then harden, so that the connecting means can also be formed by a bonding layer.

Outside the reinforced area, which forms a receiving area for the electronic element, the flexible substrate area is used in particular for vibration damping. To this end, a damping mass is also provided, which covers at least the first micro-structured or nano-structured element and a portion of the substrate protruding laterally beyond the material composite. Consequently, the element is preferably surrounded completely by the damping mass, it being possible for the portion of the substrate or the flexible substrate area that protrudes laterally beyond the material composite to originate from a lateral covering of the element. Furthermore, the whole of the substrate can also be covered.

By means of the use of the damping mass, the damping can advantageously be improved considerably—as compared with air or spring damping. In addition, by means of selecting the material of the damping mass, the damping can advantageously be adapted individually. A particular advantage additionally consists in the fact that, as a result of the structure according to the disclosure, a damping action in all spatial directions can be achieved. This in turn permits the use of such components at virtually any installation location. Furthermore, such components can have a smaller size than conventional components with gel-mounted metal plates. The damping behavior depends in particular on the mass of the material composite and the properties of the damping mass.

The component according to the disclosure therefore offers good damping characteristics with simultaneously reliable fixing of the element to the substrate. The mechanical actions transferred to the element, for example as a result of vibration, can therefore be kept very low, which increases the reliability and the service life of the component according to the disclosure.

The component according to the disclosure and also its component parts can be produced within the context of known structural and connecting technology with the use of low costs and by using known technique. The effort for application to a conventionally usable base substrate is lower, which likewise reduces the production effort and the costs.

The substrate with its flexible area or its flexible areas can be produced in its geometry and also size in minimal extents, decoupled from a tool size or tool geometry, and with the minimum number of composite partners, which offers great freedom in production. This further offers the advantage of a possible reduction in the component size, since both the overall lateral size of the component and its height can be reduced considerably.

Furthermore, the component according to the disclosure can also be produced without difficulty in large series, which likewise reduces the production costs. Further costs can be saved, since the flexible substrate of the component according to the disclosure has to be reinforced only where a component is also intended to be fixed, which permits material savings.

The substrate preferably comprises a material which has a modulus of elasticity in a range from ≤30 GPa, and specifically in particular in its flexible area or its flexible areas. Particularly preferably, the substrate consists of this material. As a result of the provision of such a material, particularly advantageous flexibility can be achieved, which means the damping characteristics of the material composite are barely restricted by the substrate but are influenced substantially by the mass of the material composite and the damping material. As a result, the damping characteristics can be matched particularly simply and reliably to the respective application. It is particularly preferred here for the substrate, in particular in its flexible area or its flexible areas, to be formed from a flexible plastic, such as in particular polyimide. Polyimide has a modulus of elasticity of 2-7 GPa, which makes it particularly suitable in addition to its good electrical insulation properties.

Within the context of an advantageous refinement of the component according to the disclosure, the substrate has a thickness in a range from ≥10 μm≤2000 μm, in particular ≥20 μm to ≤500 μm, particularly preferably ≥50 μm to ≤200 μm, specifically in particular in its flexible area or its flexible areas. In this way, it is possible to use a series of flexible materials to form the substrate. It is expedient for the thickness to be matched to the material used. For example, in the case of flexible materials having a lower modulus of elasticity, for example, a greater thickness is possible, whereas in the case of less flexible materials having a correspondingly high modulus of elasticity, lower thicknesses are particularly suitable. In a corresponding way, matching the modulus of elasticity, that is to say of the material used, to a suitable substrate thickness is possible.

Within the context of a further preferred embodiment of the component according to the disclosure, the material composite further comprises a mass body. The mass body is used in particular to adapt the mass of the material composite, by which means the damping behavior of the mass system can be adjusted particularly simply. To this end, it is particularly expedient if the mass body has a density in a range from ≥2 kg/dm$^3$. Furthermore, the level of the reinforcement can be adjusted in a suitable way by the mass body, in that, for example, inflexible materials are used. This mass body can then be fixed to the substrate or to a flexible substrate area. For example, the mass body can be a plate which is formed from copper, V2A steel, aluminum, silver, gold, other metals or else ceramic, FR4 or silicon. For example, the mass body and also the reinforced area as such have a modulus of elasticity in a range from >30 GPa. In this case, in particular, the first micro-structured or nano-structured element can be fixed to the substrate with a simple adhesive, since here, on account of the mass body, no large stresses occur. Overall, the adjustment of the mass or of the reinforcement or both can form the focus of attention.

It is particularly preferable that the mass body is a further micro-structured or nano-structured element. As a result, it is possible to dispense with a mass body applied merely for the purpose of reinforcing the substrate, a multiplicity of such elements in any case being advantageous, since they permit a wide range of application of the component.

Within the context of a further preferred embodiment of the component according to the disclosure, the damping mass is a gel, a foamed material, a granular material, an elastomer or a combination thereof, in particular a gel.

For example, the damping mass can be a foamed material which is based on a plastic, selected from the group comprising polypropylene, polyethylene, polyethylene terephthalate, polyurethane and combinations thereof. In particular, the foamed material can be formed (in situ) during the application and/or following the application. For example, a form-fitting connection can advantageously be achieved. However, it is likewise possible for the foamed material to be formed before the application to the first micro-structured or nano-structured element.

The damping mass can, however, also be a granular material. For example, the damping mass can be sand or powdery material. Since granular materials normally have a high density, when a granular material is used as damping mass, the granular material can advantageously serve additionally as a mass and improve the vibration and damping behavior.

Furthermore, the damping mass can also be an elastomer, for example a thermoplastic elastomer. Elastomers can likewise improve the vibration and damping behavior. In particular, the elastomer can be formed (in situ) during the application and after the application or, in the case of a thermoplastic elastomer, can be applied in the plastic or heated state. In this way, a form-fitting connection can likewise advantageously be achieved.

Furthermore, the damping mass can be a gel. The use of a gel offers the advantage that these are usually transparent. Thus, following the application, quality control can be carried out in order to ensure the presence of a form-fitting connection. Furthermore, gels can exhibit a pronounced inherent tackiness and thus adhere without any adhesion promoter. Furthermore, gels can be deformed plastically at room temperature and can therefore advantageously also be applied in a form-fitting manner to heat-sensitive components. In particular, the damping mass can be a silicone gel.

The damping mass can, for example, have a viscosity in a range from ≥5000 MPa·s to ≤10000 MPa·s, in particular from ≥2000 MPa·s to ≤8000 MPa·s, for example from ≥3000 MPa·s to ≤4500 MPa·s, in particular determined by means of DIN EN ISO 3219, and/or a consistency number in a range from ≥20 mm/10 to ≤100 mm/10, in particular from ≥40 mm/10 to ≤80 mm/10, for example from ≥60 mm/10 to ≤80 mm/10, in particular determined by means of DIN ISO 2137 (penetration 9.38 g hollow cone), and/or a dielectric constant in a range from ≥2 to ≤6.5, in particular from ≥2.5 to ≤3, for example from ≥2.6 to ≤2.8, in particular determined by means of DIN VDE 0303 T4, 50 Hz. By means of the viscosity of the damping mass, the damping can advantageously be adapted in accordance with the requirements of the first micro-structured or nano-structured element.

In the context of a further preferred embodiment of the component according to the disclosure, the area of the material composite which is applied to the substrate side oriented toward the damping mass and the damping mass are encapsulated by a covering made of an enveloping compound. Consequently, in particular the upper side having the first micro-structured or nano-structured element, together with the damping mass, is encapsulated by the enveloping compound. This is used for mechanical protection, for example of the damping mass, and prevents loss of the same.

It is particularly preferred for the flexible substrate area to be more flexible than the enveloping compound. In particular, the flexible substrate area as such is more elastic and/or stretchable and/or deformable than the enveloping compound under the action of the same force. For example, the flexible substrate area as such can be more elastic and/or stretchable and/or deformable by the factor five, in particular ten, than the enveloping compound under the action of the same force. As a result, the enveloping compound imparts stability to the component, whereas the flexible substrate area can serve in a suitable way for the vibration decoupling of the electronic element.

In the context of a further preferred embodiment of the component according to the disclosure, the substrate has a mechanically reinforced soldering area. This embodiment is advantageous in particular when the whole of the substrate is flexible, the flexible substrate area therefore has an extent over the whole of the substrate. In this way, reinforcement can be achieved in the soldering area or areas which, in particular, are used for fixing the substrate to a base substrate by means of solder joints.

It is further preferred for the first and/or further micro-structured or nano-structured element, in particular the first micro-structured or nano-structured element, to be selected from the group comprising micro-structured or nano-electromechanical systems, application-specific integrated circuits, sensor elements and combinations thereof.

The subject of the present disclosure is also a method for producing a component, in particular an electronic component, comprising the steps:

fixing at least one first micro-structured or nano-structured element and in particular a mass body to a flexible substrate area of a substrate by using a connecting means, a material composite being produced which at least partly reinforces the flexible substrate area;

making electrical contact with the at least one first micro-structured or nano-structured element; and applying a damping mass at least to the first micro-structured or nano-structured element and to at least one portion of the substrate protruding laterally beyond the material composite.

Within the context of the present disclosure, making electrical contact can be understood to mean making both direct and indirect contact. For example, direct electrical contact between an element and a substrate can be made by means of an electrical contact located on the element and an electrical contact located on the substrate, the electrical contact of the element making contact with or touching the electrical contact of the substrate. Indirect electrical contact between an element and the substrate can be made, for example, by an electrical contact of the element being connected to an electrical contact of the substrate via at least one further elemental means, for example a further element, an electrical conductor, for example a conductor track or wire, or an electrically conductive material, for example an electrically conductive adhesive.

This method is particularly suitable to produce a component according to the disclosure. With respect to the advantages that can be achieved in accordance with the disclosure and also with the method according to the disclosure, reference is made in particular to the explanations relating to the component according to the disclosure.

For instance, the production process of the substrate is simplified, decoupled from tool dimensions, the component dimensions can thus be reduced laterally and costs reduced. The damping characteristics are decoupled from the substrate to the greatest possible extent and dominated by the specifically adaptable damping mass.

Furthermore, for the purpose of wire-bonding, suitable wire-bonding pads can be arranged on the reinforced area, which improves the reliability of the wire-bonding connection and of the contact-making.

BRIEF DESCRIPTION OF THE DRAWINGS

Further advantages and advantageous refinements of the subjects according to the disclosure are illustrated by the drawings and explained in the following description. It should be noted that the drawings have only a descriptive character and are not conceived so as to restrict the disclosure in any way.

DETAILED DESCRIPTION

FIGS. 1 to 4 show a component 10 according to the disclosure. Identical or comparable components are designated by corresponding designations. The component 10 is in particular an electronic component, such as a sensor, and can be arranged on a base substrate 12.

Figure 1:
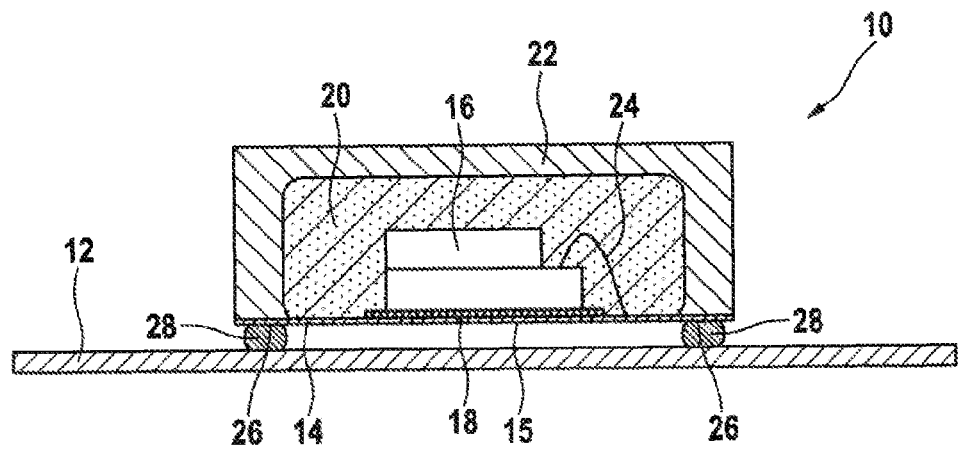
FIG. 1 shows a schematic cross section through one embodiment of a component according to the disclosure.

According to FIG. 1, the component 10 comprises a substrate 14 having at least one flexible substrate area 15. The flexible substrate area 15 can have a limited extent or else run over the whole of the substrate 14, which means that the whole of the substrate 14 is flexible. The substrate 14, preferably in its flexible substrate area 15, has in particular a modulus of elasticity in a range from ≤30 GPa and a thickness in a range from ≥10 μm to ≤2000 μm, in particular ≥20 μm to ≤500 μm. Furthermore, the flexible substrate area 15 has at least one region reinforced by forming a material composite. In the embodiment according to FIG. 1, the material composite comprises a portion of the flexible substrate area 15, a first micro-structured or nano-structured element 16 and a connecting means 18 for fixing the first micro-structured or nano-structured element 16 to the flexible substrate area 15. The connecting means 18 can be, for example, an in particular cured adhesive or a bonded connection. The materials used for the substrate 14 can be, amongst others, flexible standard materials such as in particular polyimide or FR4.

As a result of the formation of the material composite, the substrate 14 or the flexible substrate area 15 is reinforced in the area of the material composite, therefore, as compared with the flexible substrate area 15 as such, has an increased resistance capability with respect to deformation. The reinforcement is formed by the interaction of the composite partners in the material composite, that is to say in this embodiment the substrate 14 or the portion of the flexible substrate area 15, the connecting means 18 and the element 16. In particular the level of reinforcement is achieved by means of the hardness or stiffness of the element 16. The connecting means 18 should likewise be suitable to maintain the connection between flexible substrate area 15 and element 16 in the event of vibration, that is to say deformation of the flexible substrate area 15, for which reason a hard adhesive such as an epoxy adhesive is particularly suitable. As a result, deformability in the reinforced area is not possible.

According to the disclosure, a damping mass 20 is also provided, which covers at least the first micro-structured or nano-structured element 16 and a portion of the substrate 14 protruding laterally beyond the material composite. The damping mass 20 can be a gel, a foamed material, a granular material, an elastomer or a combination thereof, in particular a gel.

The area of the material composite which is applied to the substrate side oriented toward the damping mass 20 and the damping mass 20 are preferably encapsulated by a covering made of an enveloping compound 22. The enveloping compound 22 can have compressed masses for example shaped by injection molding or transfer molding, such as epoxy compounds with silicon fillers. According to the disclosre, the enveloping compound 22 therefore in particular forms a housing of the component 10 according to the disclosure.

To make electrical contact, the element 16 is connected electrically to the substrate 14, for example, via one or a multiplicity of electrical connections 24. The electrical connection 24 can be made by means of wire-bonding or in the flip-chip technique. The substrate 14 further contains electric conductor tracks, not shown, for leading the electrical connections 24 of the element 16 onward.

The substrate 14 or, if appropriate, the enveloping compound 22 can further have at least one soldering area 26, in which the substrate 14 is fixed to the base substrate 12. This can be implemented in particular by means of a solder joint 28, for example by means of solder balls or solder pads.

In the event of vibrations occurring at the installation location of the component 10 according to the disclosure, although said vibrations are passed on to the enveloping compound 22 via the solder joint 28, through the flexible substrate area 15 and the damping mass 20, they are decoupled from the elements 16 and the micro-mechanics preferably contained. The damping of the vibrations acting on the elements 16 is determined substantially by the damping mass 20, the substrate 14 or the flexible substrate area 15 and the mass of the element 16.

The material composite forms a dimensionally stable composite and thus a coherent vibrating mass in a damper system. This can be produced in a conventional structural and connecting technology process.

Furthermore, provision can be made for suitable structuring, for example of a hardening adhesive or hardening bonding connection, to be configured on the surface of the substrate 14, in order to reinforce or to stiffen electric lines and/or electrical connections on the substrate 14, which permits a secure and reliable wire-bonding substrate connection.

Consequently, the component according to the disclosure can be produced by a method comprising the steps:

fixing at least one first micro-structured or nano-structured element and in particular a mass body to a flexible substrate area of a substrate by using a connecting means, a material composite being produced which at least partly reinforces the flexible substrate area;

making electrical contact with the at least one first micro-structured or nano-structured element; and applying a damping mass at least to the first micro-structured or nano-structured element and to at least one portion of the substrate protruding laterally beyond the material composite.

Figure 2:
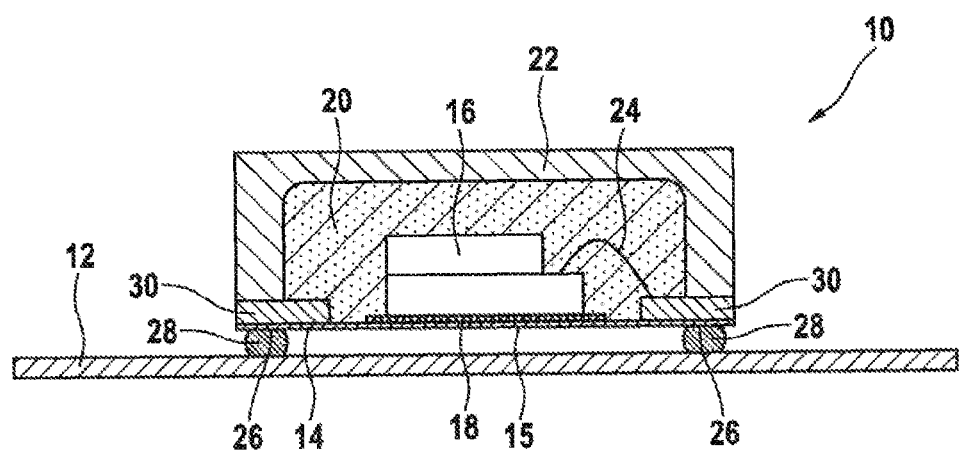
FIG. 2 shows a schematic cross section through a further embodiment of a component according to the disclosure.

FIG. 2 shows a further embodiment of the component 10 according to the disclosure. According to the figure, the substrate 14 has a mechanically reinforced soldering area 26. To this end, a mechanical reinforcement 30 can be provided in the soldering area 26. The mechanical reinforcement 30 can be formed as a glass fiber material, for example with epoxy resin, such as FR4. The mechanical reinforcement 30 can, for example, be applied in the fabrication process of the substrate 14 as a coherent frame structure, for example pressed on, and can contain further electrical contact areas and electrical through contacts. This configuration is used to increase the reliability of the solder joint 28.

Figure 3:
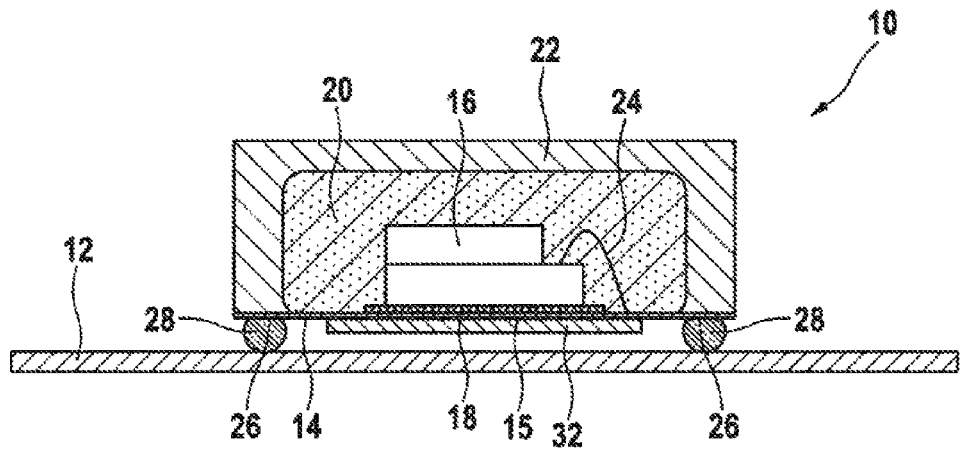
FIG. 3 shows a schematic cross section through a further embodiment of a component according to the disclosure.

FIG. 3 shows a further embodiment of the component 10 according to the disclosure. According to FIG. 3, the material composite also has a mass body 32, for example on the side of the substrate 14 opposite to the first micro-structured or nano-structured element 16. The mass body 32 can, for example, be a metal plate and furthermore adhesively bonded to the substrate 14. For example, the mass body 32 is an electronic IC element, the contact area then expediently being oriented toward the substrate 14. The electrical contact between the elements can be produced, for example, via wire bonds and through-holes in the substrate 14. Alternatively, the flip chip technique can also be used. The electrical connections can be led via conductor tracks in the substrate 14 to the solder areas 26 and to the base substrate 12. The mass body 32 is preferably a further micro-structured or nano-structured element.

Furthermore, the mass body 32 can span the first element 16 and also possibly more components laterally but not reach as far as the preferably rigid enveloping compound 22. For example, the mass body 32 can span wire-bonding pads which are used for wire bonding. The mass body 32 can contribute substantially to the reinforcement of the flexible substrate area 15, so that the forces acting on the element 16 and connecting means 18 can be kept small. Furthermore, it can have an accurately adjustable mass. This increases the reliability of the system and can contribute to optimizing the damping behavior in the spring-damper-mass system. In addition, the overall height of the component 10 according to the disclosure is reduced by this arrangement. In combination of substrate 14, damping mass 20, in particular with reference to the Shore hardness and the viscosity, and the mass of substrate 14, and also the component 18, the damping of the system can be adjusted.

Figure 4:
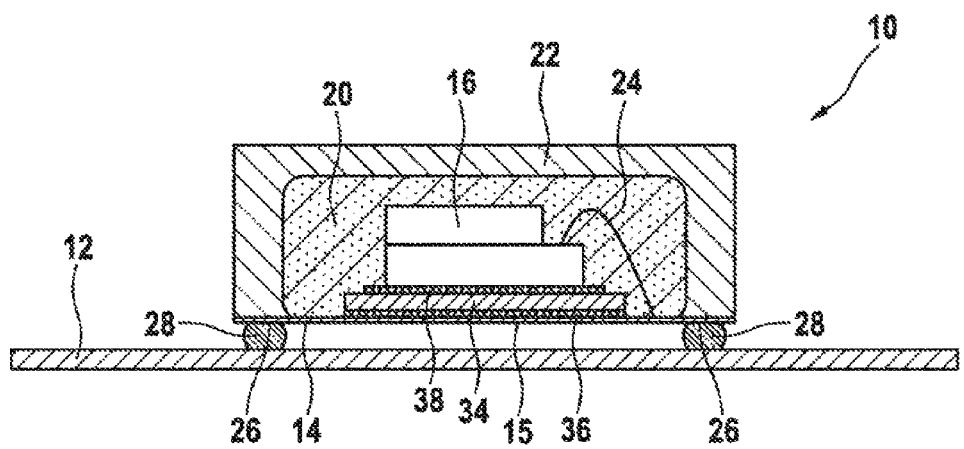
FIG. 4 shows a schematic cross section through a further embodiment of a component according to the disclosure.

FIG. 4 shows a further embodiment of the component 10 according to the disclosure. According to FIG. 4, a further component 34 is arranged between the first element 16 and the substrate 14. The component 34 can once more be a mass body and protrude laterally beyond the first element 16. The second component 34 is preferably fixed to the first element 16 and the substrate 14, for example by adhesive layers 36, 38. In this case, the second component 34 can represent a mechanical reinforcement, so that the adhesive does not necessarily have to harden.

The invention claimed is:

1. A component, comprising:
 a substrate with at least one flexible substrate area which has at least one area reinforced by forming a material composite, the material composite including at least one part of the at least one flexible substrate area;
 a first micro-structured or nano-structured element;
 a connecting mechanism configured to fix the first micro-structured or nano-structured element to the at least one flexible substrate area; and
 a damping mass configured to absorb mechanical energy and to convert the absorbed mechanical energy into heat energy through friction, and to cover at least the first micro-structured or nano-structured element and a portion of the substrate protruding laterally beyond the material composite.

2. The component as claimed in claim 1, wherein the substrate has a thickness that is greater than or equal to 10 μm and is less than or equal to 2000 μm.

3. The component as claimed in claim 1, wherein the material composite further includes a mass body.

4. The component as claimed in claim 3, wherein the mass body is a further micro-structured or nano-structured element.

5. The component as claimed in claim 4, wherein at least one of the first micro-structured or nano-structured element and the further micro-structured or nano-structured element is selected from a group comprising micro-structured or nano-electromechanical systems, application-specific integrated circuits, sensor elements, and combinations thereof.

6. The component as claimed in claim 3, wherein the mass body has a modulus of elasticity greater than 30 GPa.

7. The component as claimed in claim 3, wherein the mass body is a first mass body, and the component further comprises:
 a second mass body located on a lower side of the substrate, the first mass body located on an upper side of the substrate, the top side on a side of the substrate opposite the bottom side.

8. The component as claimed in claim 1, wherein the damping mass is one of a gel, a foamed material, a granular material, an elastomer and a combination thereof.

9. The component as claimed in claim 1, wherein an area of the material composite which is applied to a substrate side oriented toward the damping mass and the damping mass are encapsulated by a covering made of an enveloping compound.

10. The component as claimed in claim 9, wherein the at least one flexible substrate area is more flexible than the enveloping compound.

11. The component as claimed in claim 9, wherein the covering is configured as a housing of the first micro-structured or nano-structured element consisting of the enveloping compound.

12. The component as claimed in claim 1, wherein the substrate has a mechanically reinforced soldering area that is spaced apart from the damping mass.

13. The component as claimed in claim 12, wherein the mechanically reinforced soldering area includes glass fiber material.

14. The component as claimed in claim 1, wherein the damping mass has a viscosity of 2,000 MPa·s to 8,000 MPa·s.

15. The component as claimed in claim 14, wherein the damping mass has a viscosity of 3,000 MPa·s to 4,500 MPa·s.

16. The component as claimed in claim 1, wherein the damping mass has a consistency number of 20 mm/10 to 100 mm/10.

17. The component as claimed in claim 16, wherein the damping mass has a consistency number of 60 mm/10 to 80 mm/10.

18. The component as claimed in claim 1, wherein the damping mass has a dielectric constant from 2.6 to 2.8.

19. The component as claimed in claim 1, further comprising:
 a solder joint attached to a soldering area of the substrate, the soldering area located on a bottom side of the substrate,
 wherein the first micro-structured or nano-structured element is located on a top side of the substrate, the top side on a side of the substrate opposite the bottom side.

20. A method for producing a component, comprising:
 fixing at least one micro-structured or nano-structured element to a flexible substrate area of a substrate using a connecting mechanism, a material composite at least partly reinforcing the flexible substrate area;
 making electrical contact with the at least one micro-structured or nano-structured element; and
 applying a damping mass at least to the at least one micro-structured or nano-structured element and to at least one portion of the substrate protruding laterally beyond the material composite, the damping mass configured to absorb mechanical energy and to convert the absorbed mechanical energy into heat energy through friction.

* * * * *